United States Patent
Shin et al.

(10) Patent No.: US 7,285,815 B2
(45) Date of Patent: Oct. 23, 2007

(54) EEPROM DEVICE HAVING SELECTING TRANSISTORS AND METHOD OF FABRICATING THE SAME

(75) Inventors: Kwang-Shik Shin, Seoul (KR); Han-Soo Kim, Gyeonggi-do (KR); Sung-Hoi Hur, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 86 days.

(21) Appl. No.: 11/336,751

(22) Filed: Jan. 20, 2006

(65) Prior Publication Data

US 2006/0120194 A1   Jun. 8, 2006

Related U.S. Application Data

(62) Division of application No. 10/891,803, filed on Jul. 14, 2004, now Pat. No. 7,018,894.

(30) Foreign Application Priority Data

Jul. 14, 2003   (KR) ............................... 2003-47972

(51) Int. Cl.
H01L 29/76 (2006.01)
(52) U.S. Cl. ..................... 257/314; 438/257
(58) Field of Classification Search ............... 257/314, 257/315, 319, E27.103; 438/157, 195, 257
See application file for complete search history.

(56) References Cited

U.S. PATENT DOCUMENTS

| 4,780,431 | A | | 10/1988 | Maggioni et al. | ........... 438/588 |
| 6,103,573 | A | * | 8/2000 | Harari et al. | ............... 438/257 |
| 6,221,717 | B1 | | 4/2001 | Cremonesi et al. | ......... 438/258 |
| 6,420,754 | B2 | | 7/2002 | Takahashi et al. | .......... 257/326 |

* cited by examiner

*Primary Examiner*—David Vu
(74) *Attorney, Agent, or Firm*—Marger Johnson & McCollom, P.C.

(57) ABSTRACT

An EEPROM includes a device isolation layer for defining a plurality of active regions, a pair of control gates extending across the active regions and a pair of selection gates patterns that extend across the active regions and are interposed between the control gate patterns. A floating gate pattern is formed on intersection regions where the control gate patterns extend across the active regions. A lower gate pattern is formed on intersection regions where the selection gate patterns extend across the active regions. An inter-gate dielectric pattern is disposed between the control gate pattern and the floating gate pattern and a dummy dielectric pattern is disposed between the selection gate pattern and the lower gate pattern. The dummy dielectric pattern is substantially parallel to the selection gate pattern, and self-aligned with one sidewall of the selection gate pattern to overlap a predetermine width of the selection gate pattern.

8 Claims, 17 Drawing Sheets

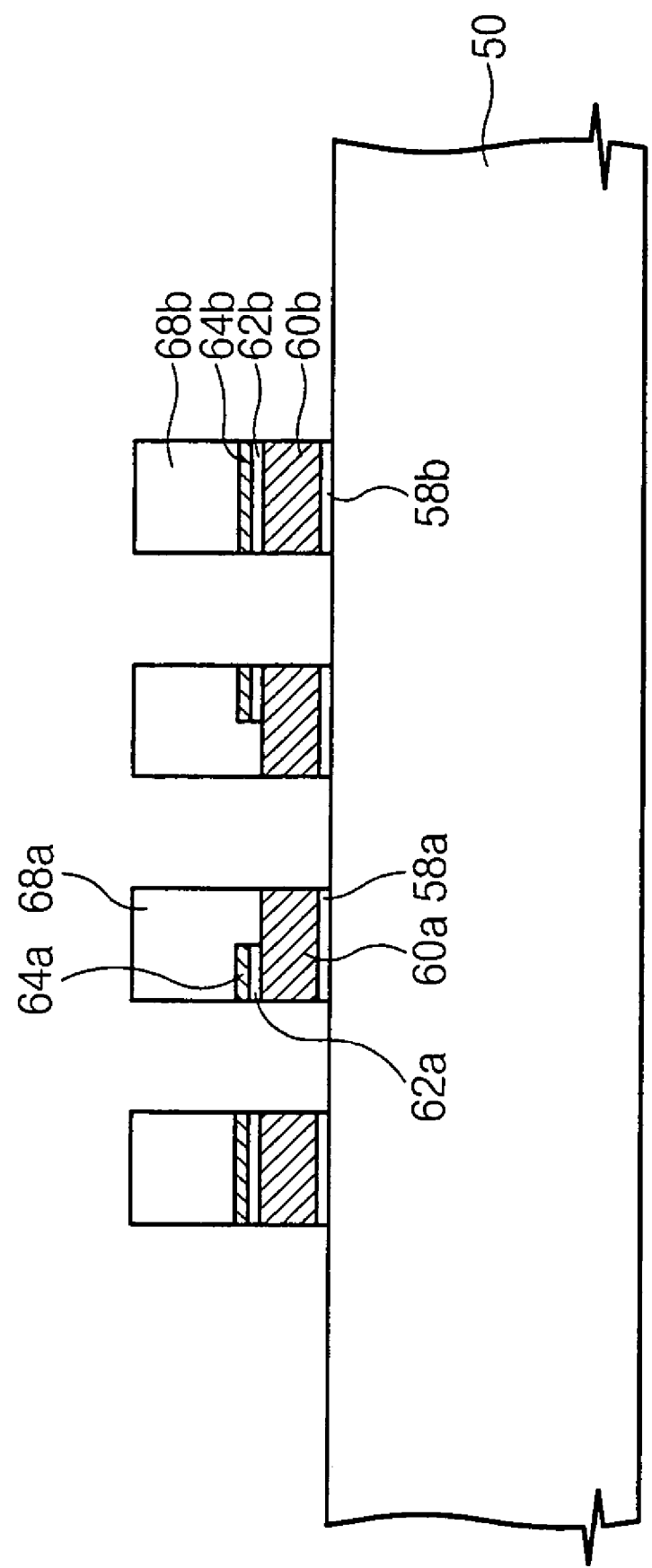

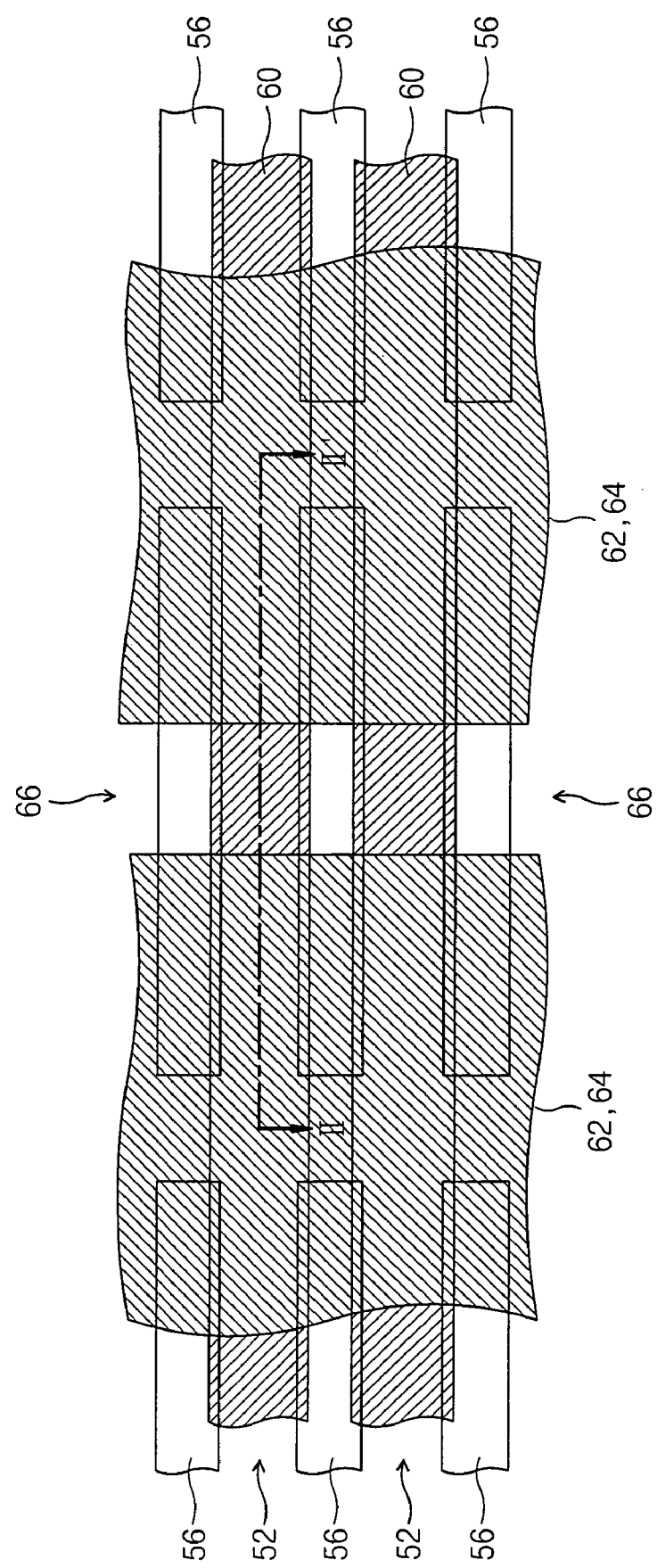

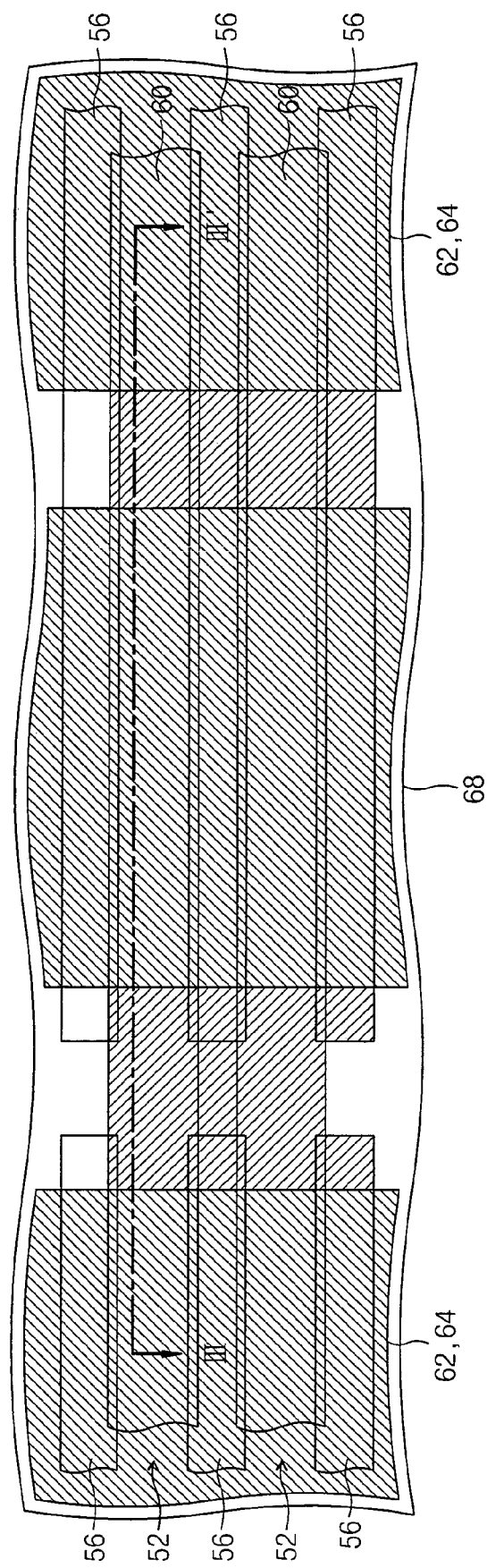

EEPROM DEVICE HAVING SELECTING TRANSISTORS AND METHOD OF FABRICATING THE SAME

This application is a divisional of U.S. patent application Ser. No. 10/891,803, filed Jul. 14, 2004, now U.S. Pat. No. 7,018,894, which claims priority from Korean Patent Application No. 2003-47972, filed on Jul. 14, 2003, in the Korean Intellectual Property Office, the disclosure of which is incorporated herein in its entirety by reference.

BACKGROUND OF THE INVENTION

1. Field of the Invention

The present invention relates to semiconductor memory devices, more specifically, to an EEPROM including a selection transistor, and a method of fabricating the same.

2. Description of the Related Art

Electrically erasable and programmable read only memory (EEPROM) is a memory device for electrically memorizing and erasing data and includes a flash memory device and a FLOTOX memory device representatively. The FLOTOX memory device includes a memory cell composed of two transistors (i.e., a memory transistor and a selection transistor). In contrast, the flash memory device includes a memory cell composed of one transistor. A cell array of the flash memory devices is categorized as a NAND type and a NOR type according to the arrangement of memory cells. Cell strings are disposed parallel in the NAND type cell array and are composed of a plurality of memory cells that are connected to each other in series. The cell string of a NAND type cell array includes selection transistors at both edges thereof similar to a FLOTOX memory device. However, the selection transistor of a NAND type flash memory device selects a cell string whereas the selection transistor of a FLOTOX memory device selects a memory cell.

An insulation layer is interposed between a lower conductive layer and an upper conductive layer in a stacked formation in the transistors of an EEPROM cell. The upper conductive layer and the lower conductive layer of the memory cell should be electrically insulated from each other in order to store data. However, the lower conductive layer of the selection transistor should be electrically connected to the upper conductive layer thereof. Therefore, various structures for connecting the lower conductive layer to the upper conductive layer in the selection transistor have been proposed. EEPROM memory devices including a selection transistor are disclosed in U.S. Pat. Nos. 4,780,431 and 6,221,717.

FIG. 1 is a top plan view illustrating a portion of cell arrays of a conventional NAND type flash memory device.

Referring to FIG. 1, a device isolation layer 2 is disposed in a semiconductor substrate to dispose a plurality of active regions 4. A string selection line SSL, a ground selection line GSL and a plurality of word lines WL are placed to extend across the active regions 4. A memory cell unit is composed of the string selection line SSL, the ground selection line GSL and the plurality of word lines WL therebetween. The NAND type cell array comprises a plurality of memory cell units in symmetrically repeated arrangement. A common source line CSL is disposed between the neighboring ground selection lines GSL for electrically connecting the active regions 4, and a bit line plug 44 that is disposed on each of the active region 4 between the neighboring string selection lines SSL.

The word line WL includes a control gate pattern 49 extending across the active regions 4 and a floating gate 34 formed on each of the active regions 4. The ground selection line GSL and the string selection line SSL include a lower gate pattern 24 and a selection gate pattern 30 in a sequentially stacked form. Contrary to this, the selection gate pattern 30 should be electrically connected to the lower gate pattern 24. Conventionally, the selection gate pattern 30 is connected to lower gate pattern 24 by a butting contact or by removing a portion of the inter-gate dielectric layer formed between the selection gate pattern 30 and the lower gate pattern 24.

FIGS. 2 and 3 are cross-sectional views taken along line I-I' of FIG. 1 illustrating a method for forming a conventional EEPROM.

Referring to FIG. 2, a gate insulation layer and a first conductive layer are formed on the semiconductor substrate 10. Then, the first conductive layer is patterned to form a first conductive pattern 14. An inter-gate dielectric layer 16 and a mask conductive layer 18 are sequentially formed on the semiconductor substrate including the first conductive pattern 14. The mask conductive layer 18 and the inter-gate dielectric layer 16 are successively patterned to form an opening 20 exposing the first conductive pattern 14. As not illustrated in the drawings, the opening 20 extends across the active regions 2. The opening 20 may be formed on the center of region S where the selection line is formed.

Referring to FIG. 3, a second conductive layer is formed on the mask conductive layer 18 with the opening 20. The second conductive layer, the mask conductive layer 18, the inter-gate dielectric layer 16a and the first conductive pattern 14 are successively patterned to form a word line WL and the selection line SL. The word line WL includes a floating gate 34, an inter-gate dielectric pattern 36, a mask conductive pattern 38 and a control gate pattern 40 in a sequentially stacked form. The selection line SL includes a lower gate pattern 24, a dummy dielectric pattern 26, a mask conductive pattern 28 and a selection gate pattern 30. The floating gate pattern 34 and the control gate pattern 40 are electrically insulated from each other but the lower gate pattern 24 and the selection gate pattern 30 are electrically connected through the opening 20. The opening 20 may be formed to have a width of, for example, half a line width L of the selection line SL. In this case, a misalignment tolerance of the opening 20 and the selection line SL is L/4.

FIGS. 4 and 5 are cross-sectional views illustrating problems of the prior art.

Referring to FIG. 4, if the opening 20 or the selection line SL is misaligned, a portion 46 of the opening 20 misses the selection line region S.

Referring to FIG. 5, the second conductive layer is formed, and the second conductive layer and the mask conductive layer are patterned using the inter-gate dielectric layer 16 as an etch stop layer to form a control gate pattern 40, a selection gate pattern 30 and mask conductive patterns 28 and 38. In this case, the first conductive pattern 14 missing the selection line region S is removed from the opening region 46 to expose the gate insulation layer 12.

Referring to FIG. 6, the inter-gate dielectric layer 16 and the first conductive pattern 14 are patterned to form a floating gate 34, a lower gate pattern 24 and an inter-gate dielectric pattern 36 and a dummy dielectric pattern 26. In this case, the semiconductor substrate in the opening region 20 may be damaged by the etching. For example, a notch 48 can be formed adjacent the selection line SL.

SUMMARY OF THE INVENTION

Embodiments of the present invention provide EEPROMs having high integration density achieved by electrically connecting an upper conductive layer and a lower conductive layer of a selection line through an opening of a dielectric layer intervening between the conductive layers and methods of fabricating the same.

Other embodiments of the present invention provide EEPROMs having high tolerance with respect to a misalignment between the opening and the selection line and methods of the same.

In some embodiments of the present invention, an EEPROM device includes a dummy dielectric pattern that is formed between a lower gate pattern and a selection gate pattern and is self-aligned with one sidewall of a selection gate pattern to overlap a predetermined width of the selection gate pattern.

In these embodiments, The EEPROM device includes a device isolation layer for defining a plurality of active regions, a pair of control gate patterns extending across the active regions, and a pair of selection gate patterns extending across the active regions between and parallel the control gate patterns. Floating gate patterns are formed at an intersection region where the control gate patterns extend across the active regions. Lower gate patterns are formed at an intersection region where the selection gate patterns extend across the active regions. An inter-gate dielectric pattern is disposed between the control gate pattern and the floating gate pattern and a dummy dielectric pattern is disposed between the selection gate pattern and the lower gate pattern. The dummy dielectric pattern is parallel to the selection gate pattern and self-aligned with one sidewall of the selection gate pattern to overlap a predetermined width of the selection gate pattern. Therefore, the selection gate pattern is electrically connected to the lower gate patterns under the selection gate pattern.

Mask conductive patterns may be further interposed between the inter-gate dielectric pattern and the control gate pattern and between the dummy dielectric pattern and the selection gate pattern, respectively.

The present invention may be adapted to a flash EEPROM device with a NAND type cell array.

The flash EEPROM device includes a device isolation layer for defining a plurality of active regions, a pair of selection gate patterns extending across the active regions, and a plurality of parallel control gate patterns that are disposed to extend across the active regions between and parallel the selection gate patterns. Floating gate patterns are formed at an intersection region where the control gate patterns extend across the active regions, and lower gate patterns are formed at an intersection region where the selection gate patterns extend across the active regions. An inter-gate dielectric pattern is disposed between the control gate pattern and the floating gate pattern and a dummy dielectric pattern is disposed between the selection gate pattern and the lower gate pattern. The dummy dielectric pattern is parallel to the selection gate pattern and self-aligned with one sidewall of the selection gate pattern to overlap a predetermined width of the selection gate pattern.

A cell array of the flash EEPROM may include a plurality of unit cell blocks. Each of the unit cell blocks include a pair of selection gate patterns and a plurality of control gate patterns therebetween. The selection gate pattern of the unit cell block faces a second selection gate pattern of a neighboring unit cell block. A portion of the selection gate pattern facing the second selection gate is connected to a lower gate pattern thereunder.

In some embodiments of the present invention, there is a method of fabricating an EEPROM device including a dummy dielectric pattern that is formed between a lower gate pattern and selection gate pattern and self-aligned with one sidewall of a selection gate pattern to overlap a predetermined width of the selection gate pattern.

The method includes forming a device isolation layer in a semiconductor substrate to define a plurality of active regions and forming a lower conductive pattern on each active region, wherein the lower conductive pattern extends to a portion of the device isolation layer parallel to the active region. A dielectric pattern is formed on the lower conductive pattern to include an opening extending across the active region and an upper conductive layer is formed on the dielectric pattern. The upper conductive layer and the dielectric pattern are successively patterned to form a control gate pattern extending across the active region and a selection gate pattern overlapping one sidewall of the opening, an inter-gate dielectric pattern self-aligned with the control gate pattern and a dummy dielectric pattern that is self-aligned with the one sidewall of the selection gate pattern to overlap a predetermined width of the selection gate pattern. Then, the lower conductive pattern is patterned to form a lower gate pattern aligned with the selection gate pattern and a floating gate pattern self-aligned with the control gate pattern.

A dielectric layer and a mask conductive layer are sequentially formed on the entire surface of the semiconductor substrate including the lower conductive pattern, and patterned successively to form an opening extending across the active region.

In some embodiments of the present invention, at least one pair of control gate patterns may be formed to extend across the active region, and a pair of selection gate patterns may be formed between each pair of control gate patterns to extend across the active regions. The opening overlaps a predetermine width of one of the two selection gate patterns in one direction and overlaps a predetermined width of the other selection gate pattern in the opposite direction.

In other embodiments of the present invention, a pair of selection gate patterns may be formed to extend across the active regions, and a plurality of parallel control gate patterns are formed between the pair of selection gate patterns to extend across the active regions. The opening extends toward the control gate patterns and overlaps a predetermined width of the selection gates. The device consists of a plurality of unit cell blocks including a pair of selection gate patterns and the control gate patterns between the pair of selection gate patterns. The selection gate patterns in each of the unit cell blocks may be formed to face another selection gate patterns in neighboring unit cell blocks. The opening overlaps a predetermine width of one of the selection gate patterns facing each other in one direction and overlaps a predetermined width of the other selection gate pattern in the opposite direction.

BRIEF DESCRIPTION OF THE DRAWINGS

FIG. 7B is a cross-sectional view taken along line II-II' of FIG. 7A illustrating an EEPROM device according to the first embodiment of the present invention.

FIG. 8A through FIG. 10A are top plan views illustrating a method of fabricating an EEPROM device according to the first embodiment of the present invention.

FIG. 8B through FIG. 10B are cross-sectional views each taken along line II-II' of FIG. 8A through 10B illustrating a method of fabricating an EEPROM device according to the first embodiment of the present invention.

FIG. 12A through FIG. 14A are top plan views illustrating a method of fabricating an EEPROM device according to the second embodiment of the present invention.

FIG. 12B through FIG. 14B are cross-sectional views each taken along line III-III' of FIG. 12A through FIG. 14A illustrate a method of fabricating an EEPROM according to the second embodiment of the present invention.

DESCRIPTION OF THE PREFERRED EMBODIMENTS

Figure 1:
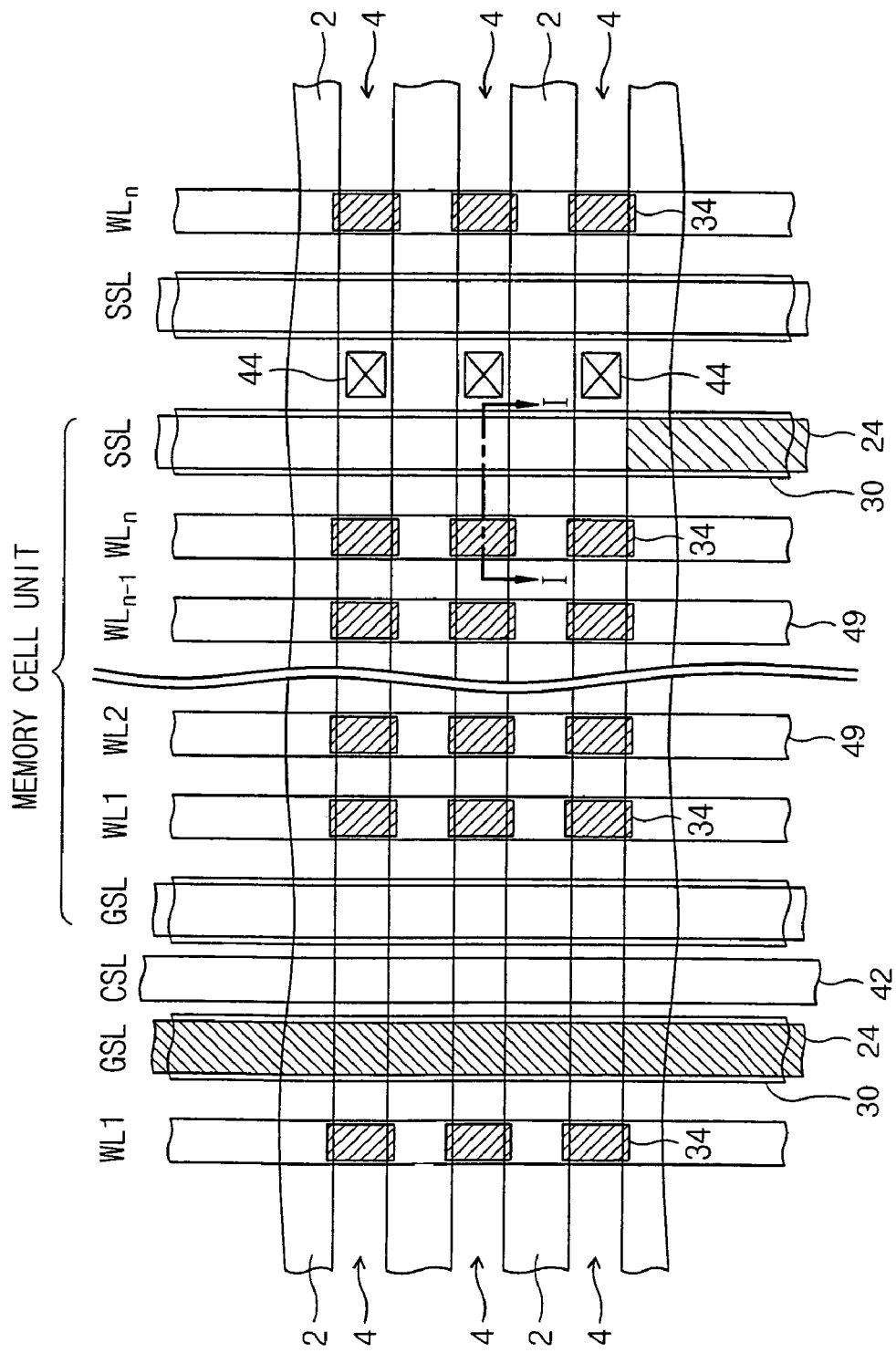
FIG. 1 is top plan view illustrating a conventional NAND type flash EEPROM.
Figure 2:
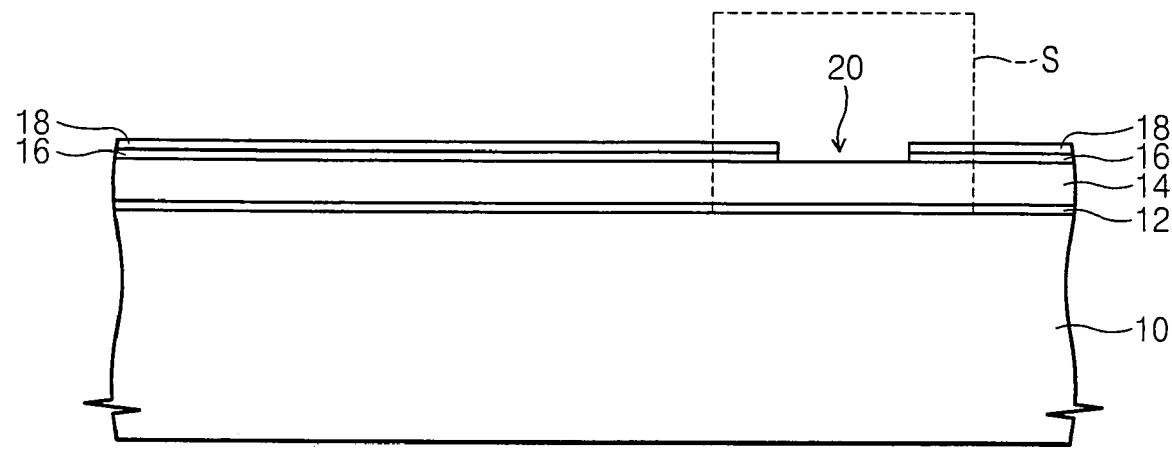
FIG. 2 and FIG. 3 are cross-sectional views taken along I-I' of FIG. 1 illustrating a method of fabricating an EEPROM according to the prior art.
Figure 3:
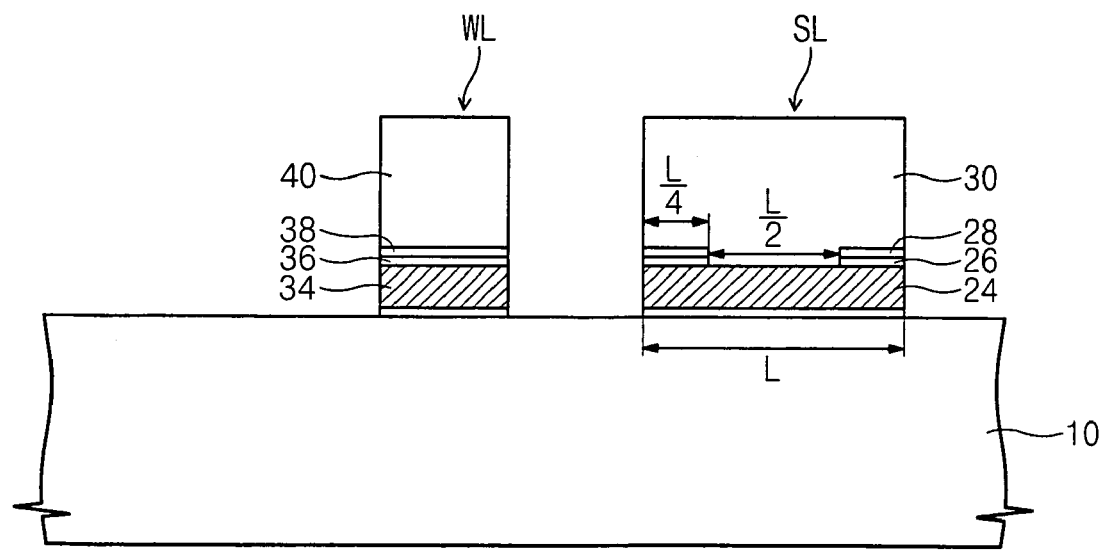
Figure 4:
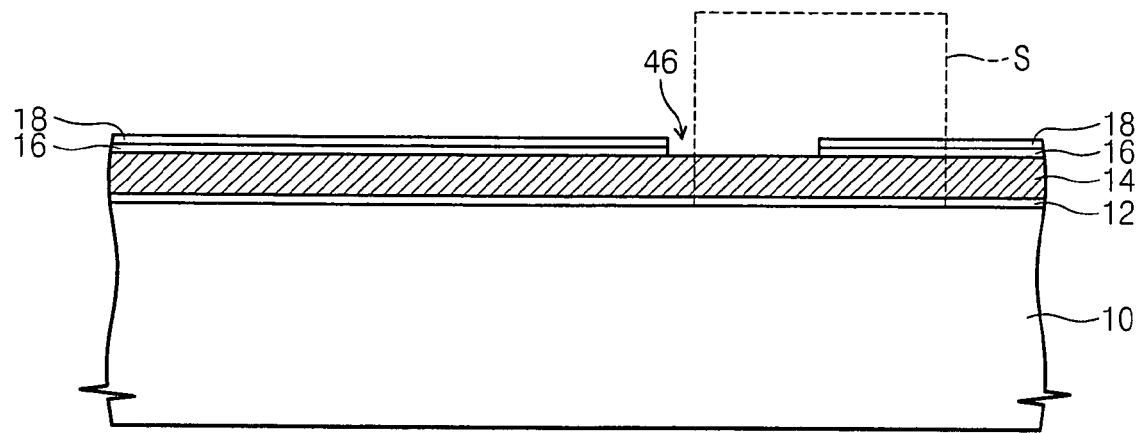
FIG. 4 through FIG. 6 are cross-sectional views illustrating problems of the EEPROM according to the prior art.
Figure 5:
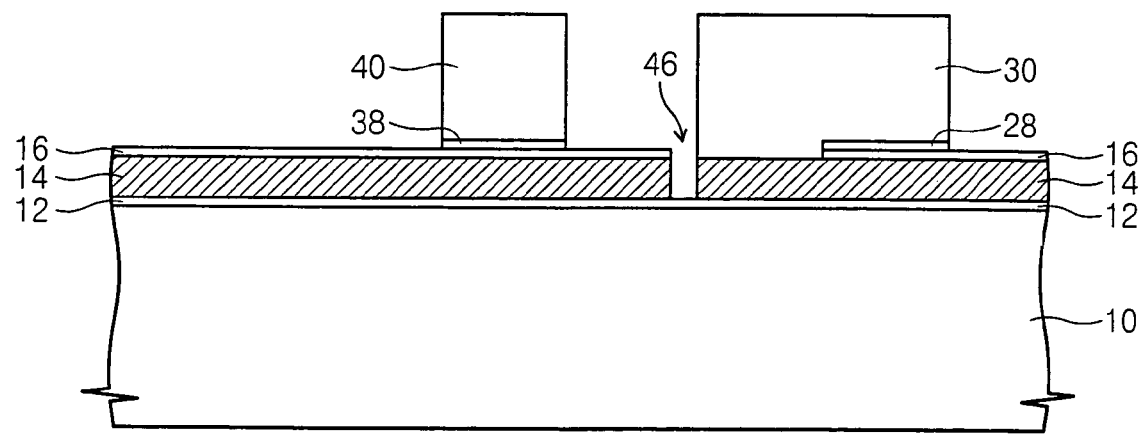
Figure 6:
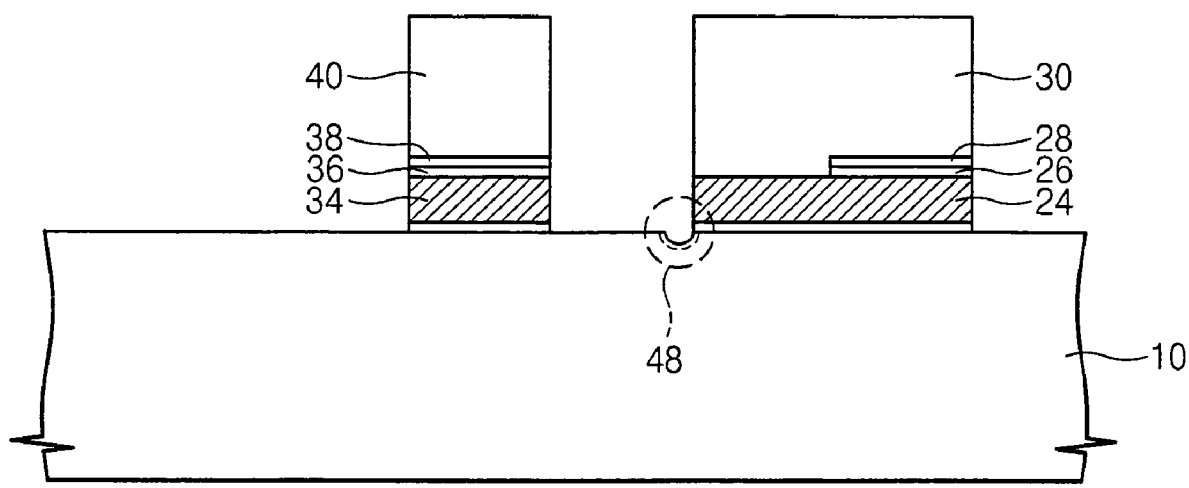
Figure 7A:
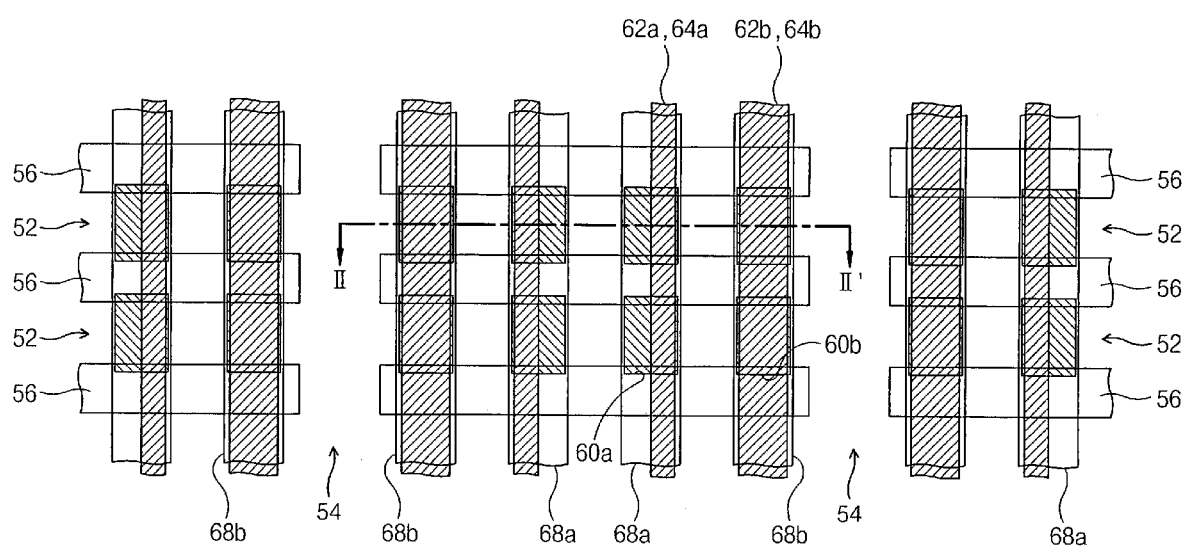
FIG. 7A is a top plan view illustrating an EEPROM according to a first embodiment of the present invention.

The present invention will now be described more fully hereinafter with reference to the accompanying drawings, in which preferred embodiments of the present invention are shown. This invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, the thickness of layers and regions are exaggerated for clarity. It will also be understood that when a layer is referred to as being "on" another layer or substrate, it can be directly on the other layer or substrate or intervening elements may also be present. Like numbers refer to like elements. FIG. 7A is a top plan view illustrating an EEPROM device according to a first embodiment of the present invention.

FIG. 7B is a cross-sectional view taken along line II-II' of FIG. 7A illustrating an EEPROM device according to the first embodiment of the present invention.

Referring to FIGS. 7A and 7B, the EEPROM device according to the fist embodiment of the present invention includes a device isolation layer 56 that is formed in a semiconductor substrate 50 to define a plurality of active regions 52. A pair of control gate patterns 68b extend across the active regions 52. A pair of selection gate patterns 68a are located between the control gate patterns 68b. Floating gate patterns 60b are disposed at the intersection region where the control gate patterns 68b extend across the active regions 52. The floating gate patterns 60b each intervene between the active regions 52 and the control gate patterns 68b. An inter-gate dielectric pattern 62b is interposed between the floating gate pattern 60b and the control gate pattern 68b. The inter-gate dielectric pattern 62b extends across the active regions 52 being self-aligned with the control gate pattern 68b. Lower gate patterns 60a are placed at the intersection region where the selection gate patterns 68a extend across the active regions 52. The lower gate patterns 60a each intervene between the active regions 52 and the selection gate patterns 68a. A dummy dielectric pattern 62a is disposed between the lower gate pattern 60a and the selection gate pattern 68a. The dummy dielectric pattern 62a has a width narrower than that of the selection gate pattern 68a. The dummy dielectric pattern 62a also has sidewalls aligned with one sidewall of the selection gate pattern 68a. The dummy dielectric pattern 62a runs over the active region 52 parallel to the selection gate pattern 68a and overlaps a portion of the selection gate pattern 68a while aligned with the selection gate pattern 68a. Therefore, each selection gate pattern 68a is electrically connected to the lower gate patterns 60a thereunder. The dummy dielectric pattern 62a is aligned with the sidewall of selection gate pattern 68a that faces the control gate pattern 68b. A mask conductive pattern 64b is disposed between the inter-gate dielectric pattern 62b and the control gate pattern 68b, and aligns itself with the inter-gate dielectric pattern 62b. The mask conductive pattern 64a also is disposed between the dummy dielectric pattern 62a and the selection gate pattern 68a, and the mask conductive pattern 64a aligns itself with the dummy dielectric pattern 62a. A first gate insulation layer 58b is disposed between the floating gate pattern 60b and the active region 52, and a second gate insulation layer 58a is disposed between the lower gate pattern 60a and the second gate insulation layer 58a. The first gate insulation layer 58b includes a thin region where charges are capable of tunneling.

As illustrated in the drawings, the pair of control gate patterns 68b and the pair of selection gate patterns 68a composes a unit cell block repeatedly arranged on the semiconductor substrate 50. A second plurality of active regions 54 may be further formed between the unit cell blocks to perpendicularly cross the active regions 52. The second active regions 54 may become common source regions. In addition, lower gate patterns connected to the same selection gate pattern are disposed apart from each other on the device isolation layer 56.

FIG. 8A through FIG. 10A are top plan views illustrating a method of fabricating an EEPROM device according to the first embodiment of the present invention.

FIG. 8B through FIG. 10B are cross-sectional views each taken along line of II-II' of FIG. 8A through 10B illustrating a method of fabricating an EEPROM device according to the first embodiment of the present invention.

Figure 8A:
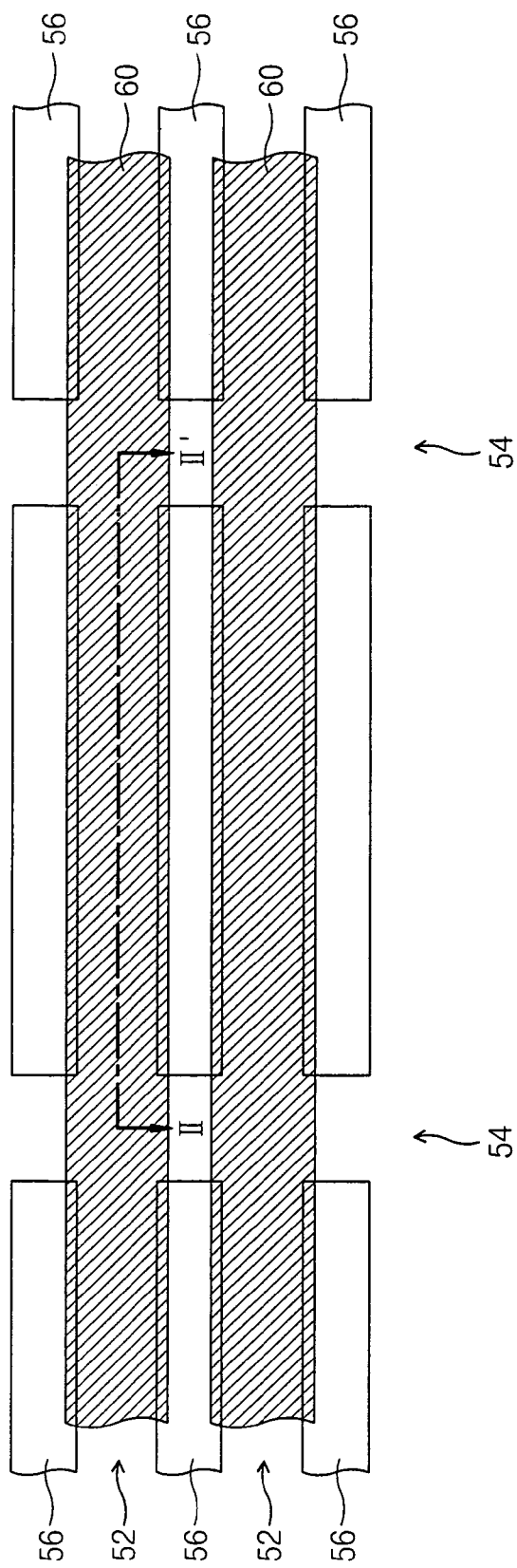
Figure 8B:
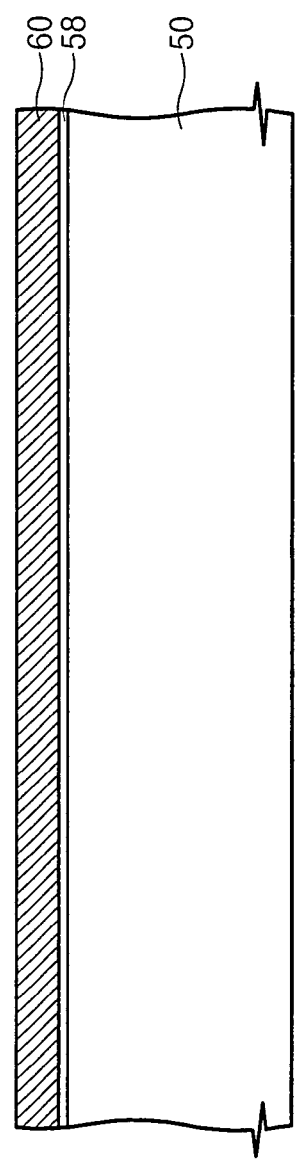

Referring to FIGS. 8A and 8B, a device isolation layer 56 is formed to define a plurality of active regions 52. In this case, a second plurality of active regions 54 may be additionally formed, which cross the active regions 52 perpendicularly and become a common source region in a subsequent process. A gate insulation layer and a lower conductive layer are formed on the semiconductor substrate 50. The lower conductive layer is patterned to form a plurality of lower conductive patterns 60. The lower conductive pattern is disposed on the corresponding active region 52. The lower conductive pattern 60 overlaps a portion of the device isolation layer 56 adjacent the active region 52.

Although not shown in the drawings, the gate insulation layer may be formed to include a thin region where charges are capable of tunneling under the floating gate that will be formed.

Figure 9B:
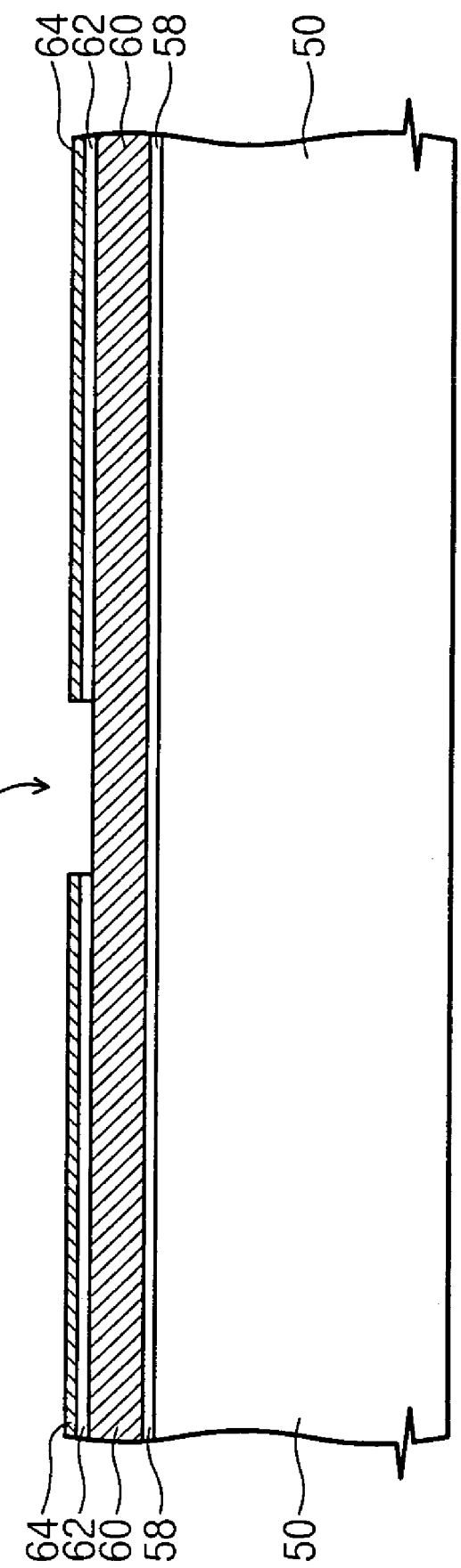

Referring to FIGS. 9A and 9B, a dielectric pattern 62 is formed overlying the lower conductive pattern 60 and has an opening 66 extending across the active regions 52. The dielectric pattern 62 is formed by stacking a dielectric layer and a mask conductive layer on the substrate and by patterning the mask conductive layer and the dielectric layer successively. Therefore, a mask conductive layer 64 may be formed on the dielectric pattern 62.

The opening 66 is formed to overlap a predetermined width of one neighboring selection gate pattern 68a in one direction, and to overlap a predetermined width of the other neighboring selection gate pattern 68a in the opposite direction. (See FIG. 7)

Figure 10A:
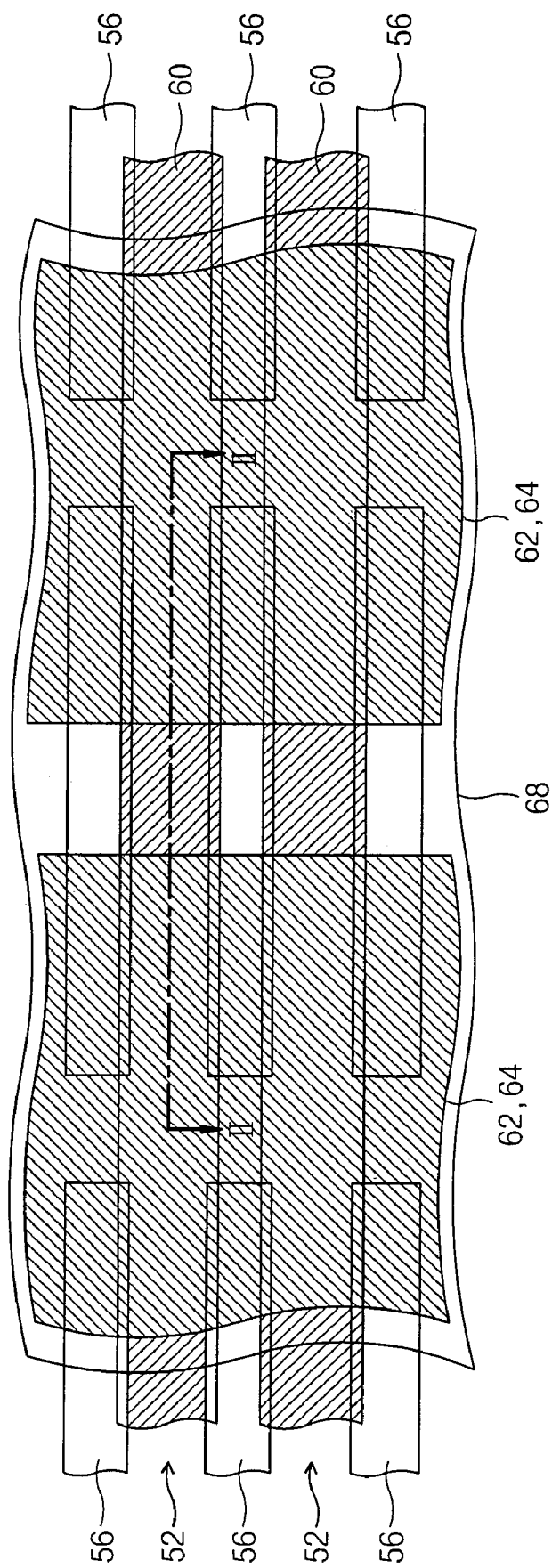
Figure 10B:
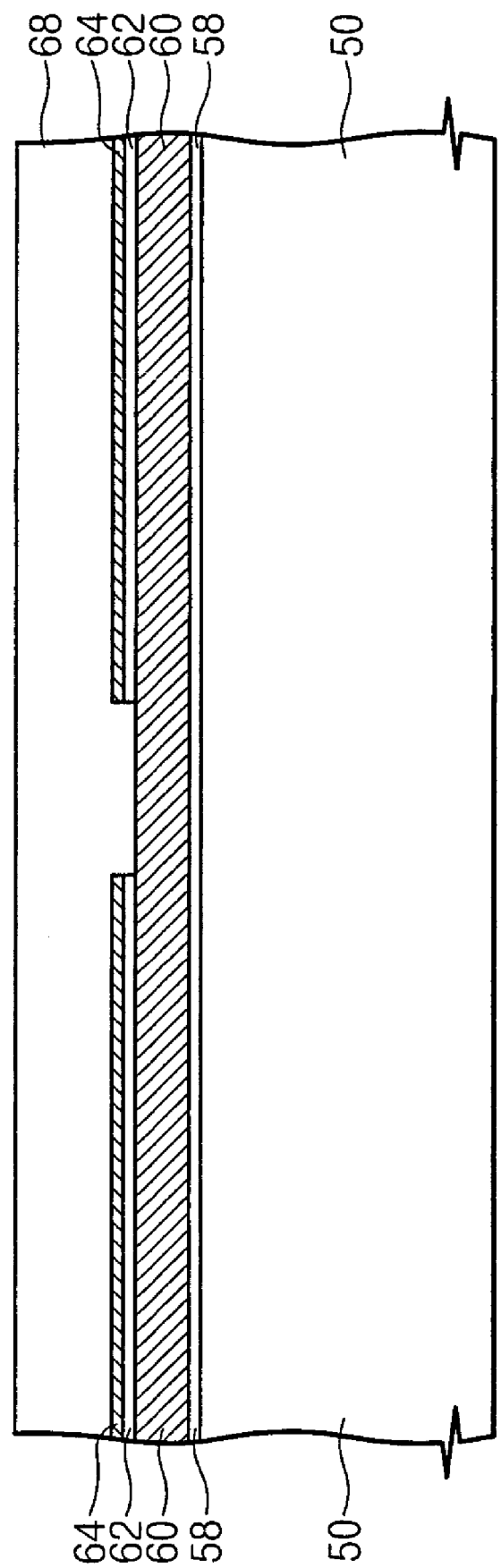

Referring to FIGS. 10a and 10b, an upper conductive layer 68 is formed over the resulting structure. The upper conductive layer 68 may be formed of the same material as the mask conductive layer 64. Moreover, the upper conductive layer 68 may be formed to have a multi-layered structure including a high conduction layer such as a metal layer or a metal silicide layer.

The upper conductive layer 68, the mask conductive layer 64 and the dielectric pattern 62 are successively patterned (not shown) to form a control gate pattern 68b and a selection gate pattern 68a that extend across the active regions 52 (See FIG. 7). This patterning process also forms a mask conductive pattern 64b and an inter-gate dielectric pattern 62b aligned with the control gate pattern 68b. In addition, a mask conductive pattern 64a and a dummy dielectric pattern 62a are formed. Preferably, one of the sidewall of the dummy dielectric pattern is aligned with the selection gate pattern 68a.

Because the opening 66 is formed to overlap a portion of the selection gate pattern 68a, the dielectric pattern 62 is not formed under the portion of selection gate pattern 68a. Therefore, the dummy dielectric pattern 62a has a sidewall self-aligned with one sidewall of the selection gate pattern 68a and overlaps a predetermine width of the selection gate pattern 68a. Accordingly, only the sidewall of the dummy dielectric pattern 62a facing the control gate pattern 68b is aligned with one of the sidewalls of the selection gate pattern 68a. As a result, the other sidewall of the selection gate pattern 68a facing another neighboring selection gate pattern is directly aligned with (contacts) the sidewall of the lower conductive pattern 60. Therefore, the sidewall of the dummy dielectric pattern 62a facing the control gate pattern 68b is exposed, while the other sidewall of the dummy dielectric pattern 62a is not exposed. The lower conductive pattern 60 is patterned, as illustrated in FIGS. 7A and 7B, to form a floating gate pattern 60b self-aligned with the control gate pattern 68b at the intersection region where the control gate pattern 68b extends across the active region 52, and a lower gate pattern 60a self aligned to the selection gate pattern 68a at the region where the selection gate pattern 68a extends across the active region 52.

The present invention may be employed in flash EEPROM devices with a NAND type cell array structure.

Figure 11A:
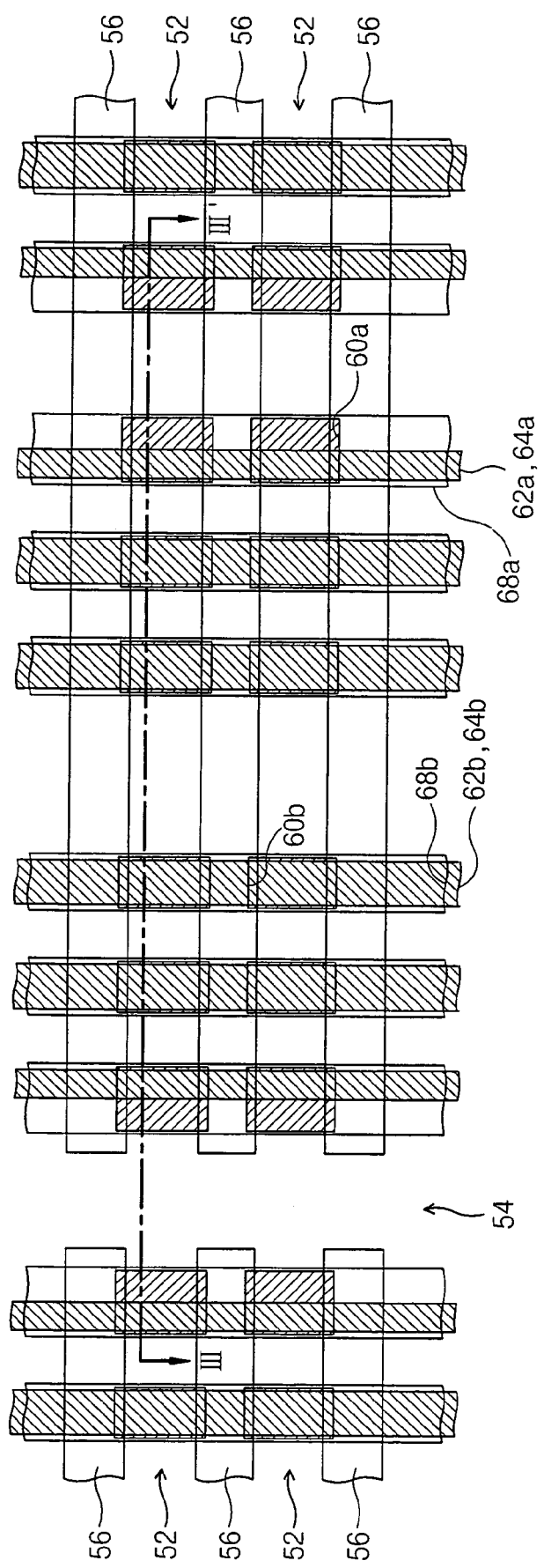
FIG. 11A is a top plan view illustrating an EEPROM according to a second embodiment of the present invention.

FIG. 11A is a top plan view illustrating an EEPROM according to a second embodiment of the present invention.

Figure 11B:
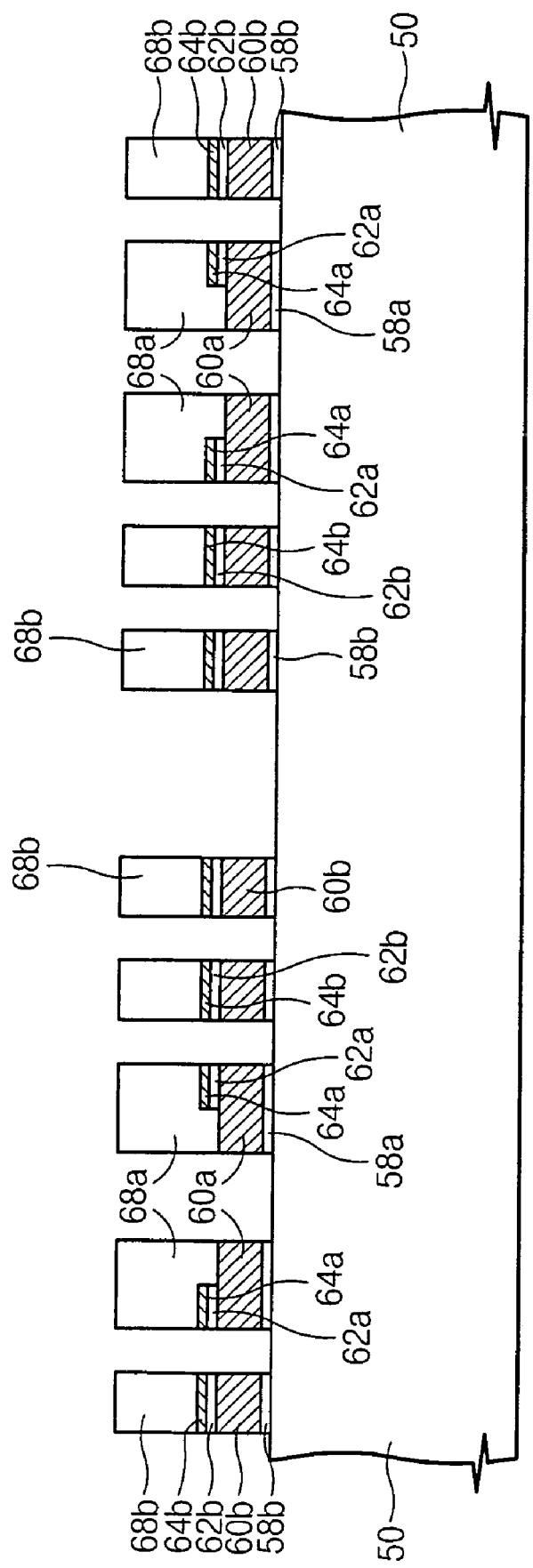
FIG. 11B is a cross-sectional view taken along line III-III' of FIG. 11A illustrating an EEPROM according to the second embodiment of the present invention.

FIG. 11B is a cross-sectional view taken along line III-III' of FIG. 11A illustrating the EEPROM according to the second embodiment of the present invention.

Referring to FIGS. 11A and 11B, an EEPROM device according to the second embodiment of the present invention includes the device isolation layer 56 that is formed on a semiconductor substrate 50 to define a plurality of active regions 52. A pair of selection gate patterns 68a extend across the active regions 52, and a plurality of control gate patterns 68b are arranged in parallel between the selection gate patterns 68a to extend across the active regions 52. The floating gate patterns 60b are disposed at the intersection region where the control gate patterns 68b extend across the active regions 52. The floating gate pattern 60b is disposed between the active region 52 and the control gate pattern 68b. An inter-gate dielectric pattern 62b is disposed between the floating gate pattern 60b and the control gate pattern 68b. The inter-gate dielectric pattern 62b self-aligns with the control gate pattern 68b. Lower gate patterns 60a are disposed at the intersection region where the selection gate patterns 68a extend across the active regions 52. The lower gate pattern 60a is disposed between the active region 52 and the selection gate pattern 68a. A dummy dielectric pattern is disposed between the lower gate pattern 60a and the selection gate pattern 68a. The dummy dielectric pattern 62a is narrower than the selection gate pattern 68a in width and has a sidewall self aligned with one sidewall of the selection gate pattern 68a. The dummy dielectric pattern 62a extends across the active regions 52 and overlaps a portion of the selection gate pattern 68a. The dummy dielectric pattern 62a is self-aligned and parallel with the selection gate pattern 68a. Therefore, each of the selection gate patterns 68a is electrically connected to the lower gate pattern 60a thereunder. The dummy dielectric pattern 62a is formed to self-align with a sidewall of the selection gate pattern 68a facing the control gate pattern 68b. A mask conductive pattern 64b is disposed between the inter-gate dielectric pattern 62b and the control gate pattern 68b and self-aligns to the inter-gate dielectric pattern 62b. The mask conductive pattern 64a also is disposed between the dummy conductive pattern 62a and the selection gate pattern 68a and aligns itself to the dummy dielectric pattern 62a. A first gate insulation layer 58b is disposed between the floating gate pattern 60b and the active region 52, and a second gate insulation layer 58a is disposed between the lower gate pattern 60a and the active region 52. The first gate insulation layer 58b is a thin insulation layer where charges are capable of tunneling.

As illustrated in the drawings, the pair selection gate pattern 68a and a plurality of control gate patterns 68b therebetween compose a unit cell block repeated and arranged on the semiconductor substrate. A second plurality of active regions 54 may be further formed to neighbor and parallel one of the selection gate patterns 68a in each cell block. A common source region may be formed by doping into the second active regions 54 with impurities. To the contrary, a common source region may be formed with a conductive pattern corresponding to the common source region and electrically connected to each active region 52 without the active region parallel to the gate patterns. In a NAND type cell array, the selection gate pattern 68a is disposed to face a selection gate pattern 68a in a neighboring cell block. The lower gate patterns connected to the same selection gate pattern are placed apart from each other on the device isolation layer.

FIG. 12A through FIG. 14A are top plan views illustrating a method of fabricating an EEPROM device according to the second embodiment of the present invention.

FIG. 12B through FIG. 14B are cross-sectional views each taken along line III-III' of FIG. 12A through 14A illustrating a method of fabricating an EEPROM according to the second embodiment of the present.

Figure 12A:
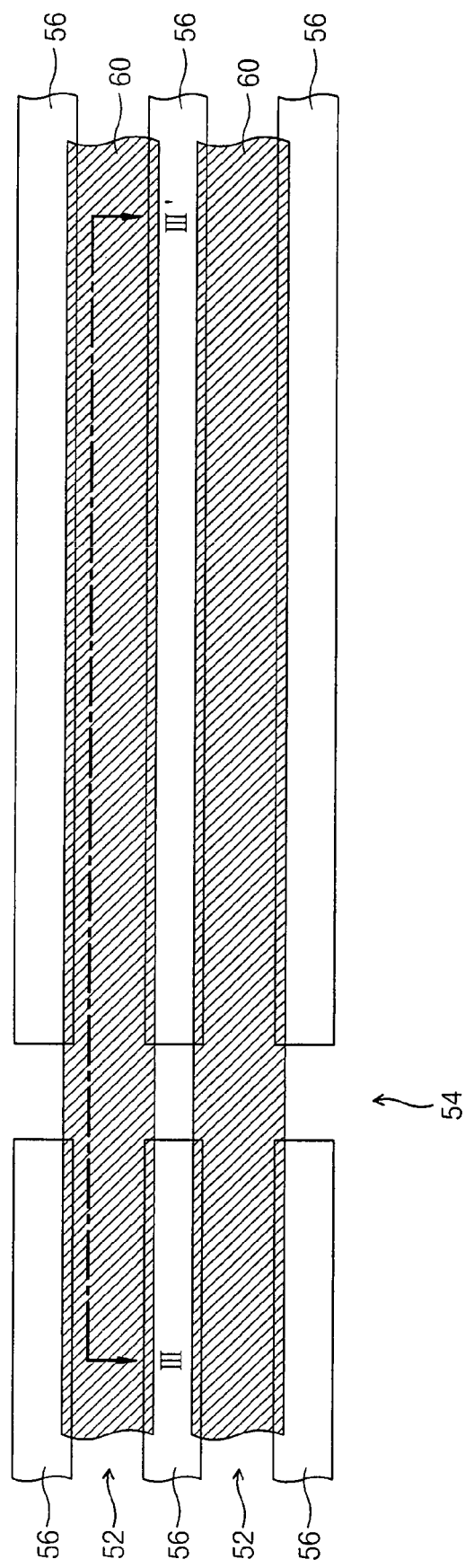
Figure 12B:
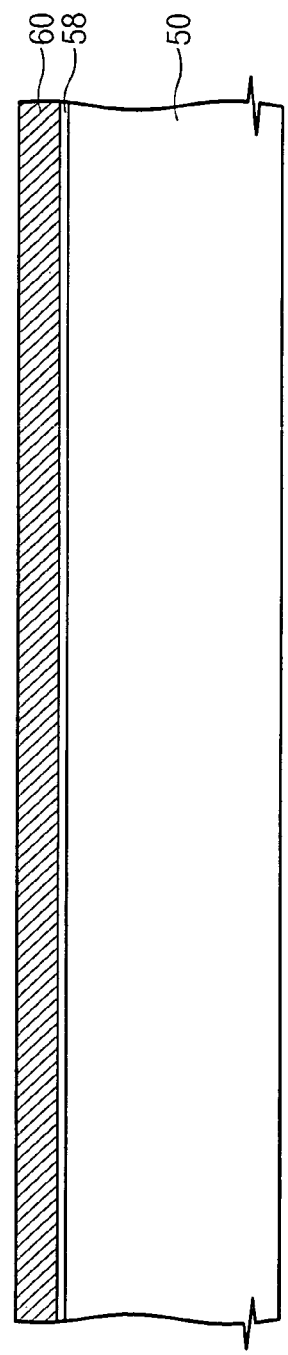

Referring to FIG. 12A and FIG. 12b, a device isolation layer 56 is formed on a plurality of active regions 52. In this case, a second plurality of active regions 54 may be further formed to cross the active regions 52. The second active regions 54 will be the regions where common source regions are formed in a subsequent process. A gate insulation layer and a lower conductive layer are formed on the entire surface of the semiconductor substrate 50 and the lower conductive layer is patterned to form a plurality of lower conductive patterns 60. The lower conductive patterns 60 each correspond with the active regions 52. The lower conductive pattern 60 is placed on the corresponding active region. The lower conductive pattern 60 overlaps a portion of the device isolation layers adjacent the corresponding active region 52.

While forming, the lower conductive pattern 60 may be formed to extend across the active regions 52 and to be connected in the region where selection gate patterns will be formed. In this case, the lower conductive patterns 60 may be formed apart from each other on the device isolation layer 56 because the connected portions of the lower conductive patterns 60 may be deformed due to a proximity effect.

Figure 13A:
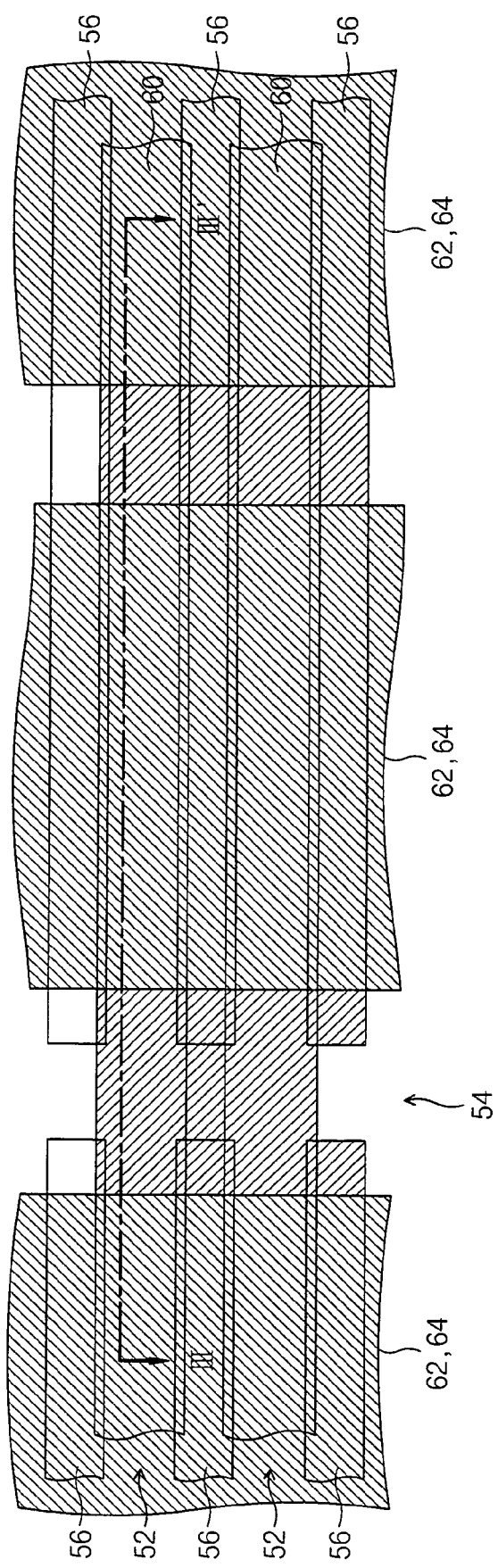
Figure 13B:
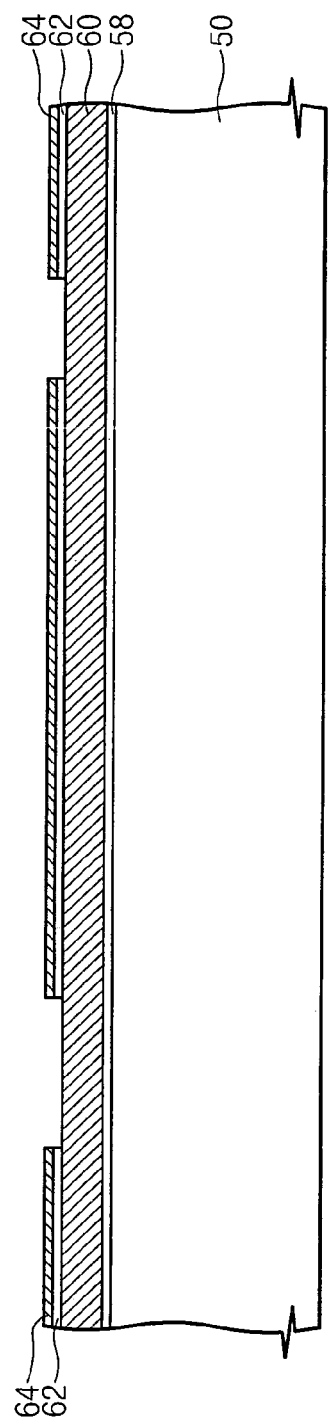

Referring to FIGS. 13A and 13B, a dielectric pattern 62 is formed on the entire surface of the substrate including the lower conductive pattern 60 to have an opening 66 extending across the active regions 52. The dielectric pattern 62 may be formed by stacking a dielectric layer and a mask conductive layer on the entire surface of the substrate and successively patterning the mask conductive layer and the dielectric layer. Therefore, a mask conductive layer 64 may be formed on the dielectric pattern 62.

The opening 66 is formed to overlap a predetermined region of one neighboring selection gate pattern 68a in one direction and to overlap a predetermined region of another neighboring selection gate pattern 68a in the opposite direction.

Figure 14B:
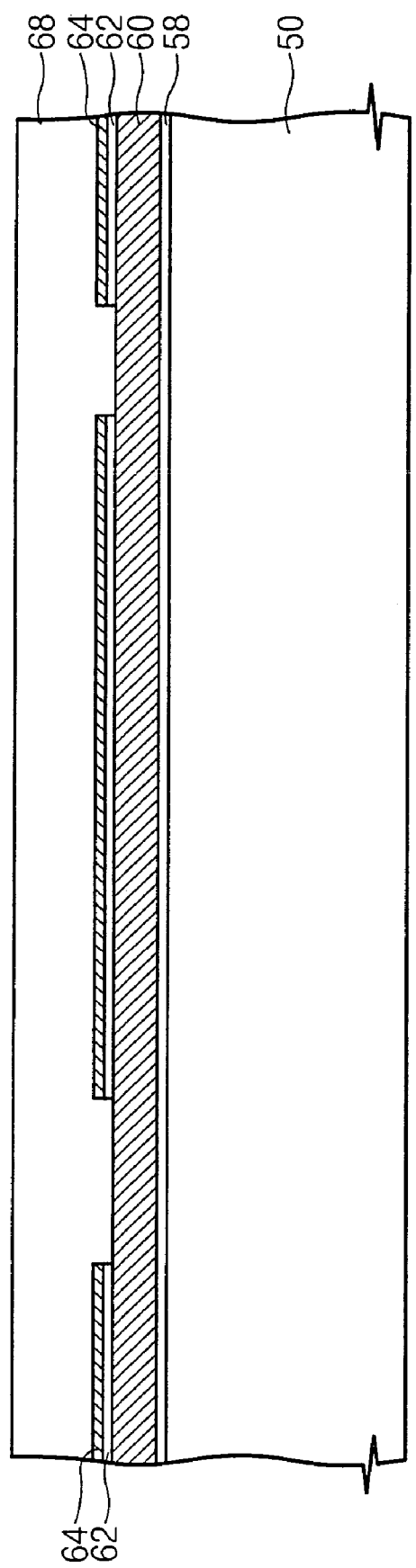

Referring to FIGS. 14a and 14b, an upper conductive layer 68 is formed on the entire surface of the substrate. The upper conductive layer 68 may be formed of the same material as the mask conductive layer 64. Moreover, the upper conductive layer 68 may be formed of multiple layers including a high conduction layer such as a metal layer or a metal silicide layer similar to conventional high-rate, low-voltage devices.

Although not shown in the drawings, the upper conductive layer 68, the mask conductive layer 64 and the dielectric pattern 62 are successively patterned to form a control gate pattern 68b and a selection gate pattern 68a that extend across the active regions 52, a mask conductive pattern 64b and an inter-gate dielectric pattern 62b that self-align with the control gate pattern 68b, and a mask conductive pattern 64a and a dummy dielectric pattern 62a of which sidewalls self-align with the selection gate pattern 68a. The opening 66 is formed to overlap a portion of the selection gate pattern 68a, such that a dielectric pattern 62 is not formed under the portion of the selection gate pattern 68a. Therefore, the dummy dielectric pattern 62a has sidewall aligned with one sidewall of the selection gate pattern 68a and overlaps a predetermined width of the selection gate pattern 68a. The sidewall of the dummy dielectric pattern 62a facing the control gate pattern 68b is aligned with the one sidewall of the selection gate pattern 68a. Thus, the other sidewall of the selection gate 68a facing another neighboring selection gate pattern 68a contacts the lower conductive pattern 60 directly. Continuously, the lower conductive pattern 60 is patterned to form a floating gate pattern 60b aligning itself with the control gate pattern 68b at the region where the control gate pattern 68b extends across the active region 52, and to form a lower gate pattern 60a self-aligning with the selection gate pattern 68a at the region where the selection gate pattern 68a extends across the active region 52.

According to the present invention, a dummy dielectric pattern intervening between a selection gate pattern and a lower gate pattern has sidewall aligned with one sidewall of the selection gate pattern, and overlaps a predetermine portion of the selection gate pattern. The dummy dielectric pattern may be formed by etching a dielectric pattern to include an opening to self-align with the selection gate pattern. The opening overlaps the selection gate pattern in one direction, thereby having a higher mis-alignment margin then the prior art. Moreover, the lower gate patterns under the selection gate pattern are disposed apart from each other on the device isolation layer. When a continuous lower gate pattern is formed to extend across the active regions parallel to the selection gate pattern, the shape of a floating gate pattern adjacent the selection gate may be deformed because of a proximity effect of a photolithographic process. The structure according to the present invention, however, appears uniform distribution of cell characteristic without deterioration due to the proximity effect.

Although the exemplary embodiments of the present invention have been described in detail, it should be understood that many variations and/or modifications of the basic inventive concepts herein taught, which may appear to those skilled in the art, will still fall within the spirit and scope of the present invention as defined in the appended claims.

What is claimed is:

1. A non-volatile memory device, comprising:
   a device isolation layer for defining a plurality of active regions in a semiconductor substrate;
   a pair of control gate patterns extending across the active regions;
   a pair of selection gate patterns extending across the active regions between the pair of control gate patterns;
   floating gate patterns formed at an intersection region where the control gate patterns extend across the active regions; and
   lower gate patterns each formed at an intersection region where the selection gate patterns extend across the active regions;
   inter-gate dielectric patterns each disposed between corresponding one of the control gate patterns and corresponding one of the floating gate patterns; and
   dummy dielectric patterns each disposed between corresponding one of the selection gate patterns and corresponding one of the lower gate patterns, each of the sidewall of the dummy dielectric patterns self-aligned with one sidewall of the selection gate pattern and overlapping a predetermined width of the selection gate pattern, each of said sidewall of the dummy dielectric pattern facing corresponding one of the pair of control gate patterns.

2. The device of claim 1, wherein the selection gate pattern is electrically connected to the lower gate patterns under the selection gate pattern.

3. The device of claim 1, further comprising mask conductive patterns each intervening between the inter-gate dielectric pattern and the control gate pattern and between the dummy dielectric pattern and the selection gate pattern.

4. An EEPROM device, comprising:
   a device isolation layer for defining a plurality of active regions;
   a pair of selection gate patterns extending across the active regions;
   a plurality of control gate patterns extending across the active regions between the selection gate patterns parallel to the selection gate patterns;
   floating gate patterns formed at an intersection region where the control gate patterns extend across the active regions;
   lower gate patterns formed at an intersection region where the selection gate patterns extend across the active regions;

an inter-gate dielectric pattern disposed between the control gate pattern and the floating gate pattern; and a dummy dielectric pattern disposed between the selection gate pattern and the lower gate pattern, wherein the dummy dielectric pattern is substantially parallel to the selection gate pattern and self-aligned with one sidewall of the selection gate pattern to overlap a predetermined width of the selection gate pattern.

5. The device of claim 4, wherein the dummy dielectric pattern facing the selection gate pattern is self-aligned with one sidewall of the selection gate pattern.

6. The device of claim 4, wherein the selection gate pattern is electrically connected to the lower gate patterns under the selection gate pattern.

7. The device of claim 4, further comprising mask conductive patterns each intervening between the inter-gate dielectric pattern and the control gate pattern and between the dummy dielectric pattern and the selection gate pattern.

8. The device of claim 4, wherein further comprises a plurality of unit cell blocks defined at the substrate, wherein a unit cell block includes a pair of selection gate patterns and a plurality of control gate patterns therebetween, wherein the selection gate pattern of the unit cell block faces another selection gate pattern of a neighboring unit cell block, and wherein a portion of the selection gate pattern facing another selection gate is connected to the lower gate pattern thereunder.

* * * * *